United States Patent [19]

Haynos

[11] 3,874,931

[45] Apr. 1, 1975

[54] SOLAR CELL ARRAY

[75] Inventor: Joseph Gabrial Haynos, Rockville, Md.

[73] Assignee: Communications Satellite Corporation (Comsat), Washington, D.C.

[22] Filed: Aug. 21, 1973

[21] Appl. No.: 390,267

Related U.S. Application Data

[62] Division of Ser. No. 273,578, July 20, 1972.

[52] U.S. Cl. .................... 136/89

[51] Int. Cl. .................... H01l 15/02

[58] Field of Search .................... 136/89, 151

[56] References Cited

UNITED STATES PATENTS

| | | | |
|---|---|---|---|
| 457,880 | 8/1891 | Nadden | 136/151 |
| 1,633,257 | 6/1927 | Lahey | 136/151 |
| 2,989,575 | 6/1961 | Wallace, Jr. | 136/89 |
| 3,205,381 | 9/1965 | Smith | 136/89 X |
| 3,330,700 | 7/1967 | Galub et al. | 136/89 |
| 3,446,676 | 5/1969 | Webb | 136/89 |
| 3,454,774 | 7/1969 | Wizenick | 136/89 X |
| 3,459,391 | 8/1969 | Haynos | 136/89 X |
| 3,466,198 | 9/1969 | Webb | 136/89 |

OTHER PUBLICATIONS

F. C. Treble, "Progress in Advanced Solar Array Development," in Conf. of 8th IEEE Photovoltaic Specialists Conf., Seattle, Wash. 8/1970, pp. 319–325.

*Primary Examiner*—Allen B. Curtis
*Attorney, Agent, or Firm*—Sughrue, Rothwell, Mion, Zinn & Macpeak

[57] ABSTRACT

Individual solar cells are placed bottom down on preprinted areas of a substrate by means of an adhesive. The adhesive does not cover the entire bottom of the solar cell but leaves at least a region of the bottom of each cell which is to be welded to an interconnector free from adhesive. The substrate is pre-punched to have apertures therein at positions corresponding to the positions of contact between an interconnector and the bottom electrode of each cell. Thin electrical interconnectors are slid into position, each interconnector touching the top electrode of at least one cell and the bottom electrode of at least one adjacent cell. The interconnectors are welded directly to the top electrodes and through the pre-punched apertures to the bottom electrodes. Additional holding of the cells to the substrate is provided by button-type chemical/-mechanical fasteners which extend from the bottom electrodes through additional pre-punched holes in the substrate and have wider regions below the substrate to mechanically and adhesively hold the substrate to the cells.

2 Claims, 8 Drawing Figures

SOLAR CELL ARRAY

This is a division of application Ser. No. 273,578, filed July 20, 1972.

BACKGROUND OF THE INVENTION

The present invnention is a simplified method of assembling solar cell arrays and the array resulting therefrom.

A solar cell array comprises a plurality of individual cells and interconnector means for electrically connecting adjacent cells in a matrix. Typically, the individual cells are arranged in columns and rows and the interconnector means are positioned to connect all cells in the same column in parallel circuit arrangement, and to connect all cells in the same row in series circuit connection. Each interconnector means is welded to the top electrodes of all cells in one column, and to the bottom electrodes of all cells in the adjacent column.

The standard method of forming the cells into an array of the type described beings with the step of aligning the cells in the rows and columns. This is done on an alignment and spacing jig. The metallic interconnectors are attached to the cell electrodes by soldering or welding. Since each interconnector extends from the top electrode of a first column of cells to the bottom electrode of a second column of cells, there is a lot of handling and movement of individual cells in order to properly index or position the cells and to complete the soldering or welding.

The electrical series-parallel cell matrix having been formed, it is necessary to attach the cell matrix to a rigid or flexible substrate. To accomplish that step, the cell matrix is lifted from the jig and placed onto the substrate which has been coated with a thick enough layer of adhesive to ensure adherence of the cell matrix to the substrate under operating conditions. Since the matrix is moved, there must be some means to hold the cells together in the matrix. This function is accomplished by the electrical interconnecting means, but in order for the interconnecting means to provide sufficient mechanical stability, the interconnecting means must be much bulkier than would be required to merely carry out the electrical function thereof.

There are a number of disadvantages of having relatively bulky interconnecting means. They more readily transmit stresses that are imposed on the array during vibration or internal shock. There is additional stress at the interface of a cell and an interconnector caused by the large difference of thermal expansion of the cell material, such as silicon, and the interconnector material, such as silver or copper. The magnitude of the stress is directly proportional to the ratio of the cross-sectional area of the materials that are joined.

The method of placing the matrix on the substrate usually results in adhesive flowing to positions to adhere the interconnecting means to the substrate. Thus, any stresses experienced by the substrate are directly transferred to the interconnector. The thick adhesive layer reduces the flexibility of the array because of the added difficulty of bending a bulk of adhesive. Also; repairability of arrays is difficult, because the substrate has to be cut in order to repair broken interconnectors.

SUMMARY OF THE INVENTION

In accordance with the present invention, a solar cell array is formed which is free from the disadvantages mentioned above. There is very little handling of the individual cells and no handling of an interconnector matrix without a substrate attached thereto. The interconnectors need not provide any mechanical holding function and only need be large enough to carry out the necessary electrical interconnection function. The thick layer of adhesive is eliminated thereby increasing the flexibility of the array. No adhesive covers the interconnectors and the interconnections can be repaired without cutting the substrate.

All these advantages result from forming the array by a method which is simpler to carry out and requires less handling of the cells than the prior art method. A rigid or flexible substrate is first prepared by printing, or depressing, an outline of the positions of the cells in the array. Apertures are punched in the substrate in regions which correspond to the area of the bottom electrode that is to be welded to the interconnecting means. Each cell is placed in the pre-printed position of the substrate by means of an adhesive. The adhesive is placed to adhere the bottom of each cell to the substrate but is not placed in the region of the aforementioned apertures. The adhesive holds the cells to the substrate and retains them in their proper matrix positions. The interconnectors are inserted so as to extend from the top electrodes of one column of cells to the bottom electrodes of the adjacent column of cells. The interconnectors are then welded or soldered to the top electrodes. Next, the substrate with the cells thereon is turned over and the interconnectors are welded or soldered to the bottom electrodes through the apertures which are prepunched in the substrate. Unlike the prior art, the matrix arrangement of cells is never handled in the absence of the supporting substrate, and therefore the interconnectors may be extremely thin when compared with the interconnectors of the prior art.

An alternate feature of the invention is the addition of further holding means for securely holding the cells to the substrate. When this alternative feature is to be used, additional apertures are pre-punched into each region of the substrate that is to receive an individual cell. Following the initial placement of each cell in its respective position, the substrate with cells thereon is turned over and a mask is placed on the substrate. The mask has apertures thereon which are larger than but communicate with the second group of apertures pre-punched in the substrate. An adhesive, such as silicone, is pressed into the apertures of the mask and through the apertures of the substrate. The adhesive adheres firmly to the bottom of the cells and thus fastens the cells to the substrate in a manner similar to a button type fastener. After the adhesive cures, the mask is removed.

DETAILED DESCRIPTION OF THE DRAWINGS

Figures 1, 2, 3, 4:
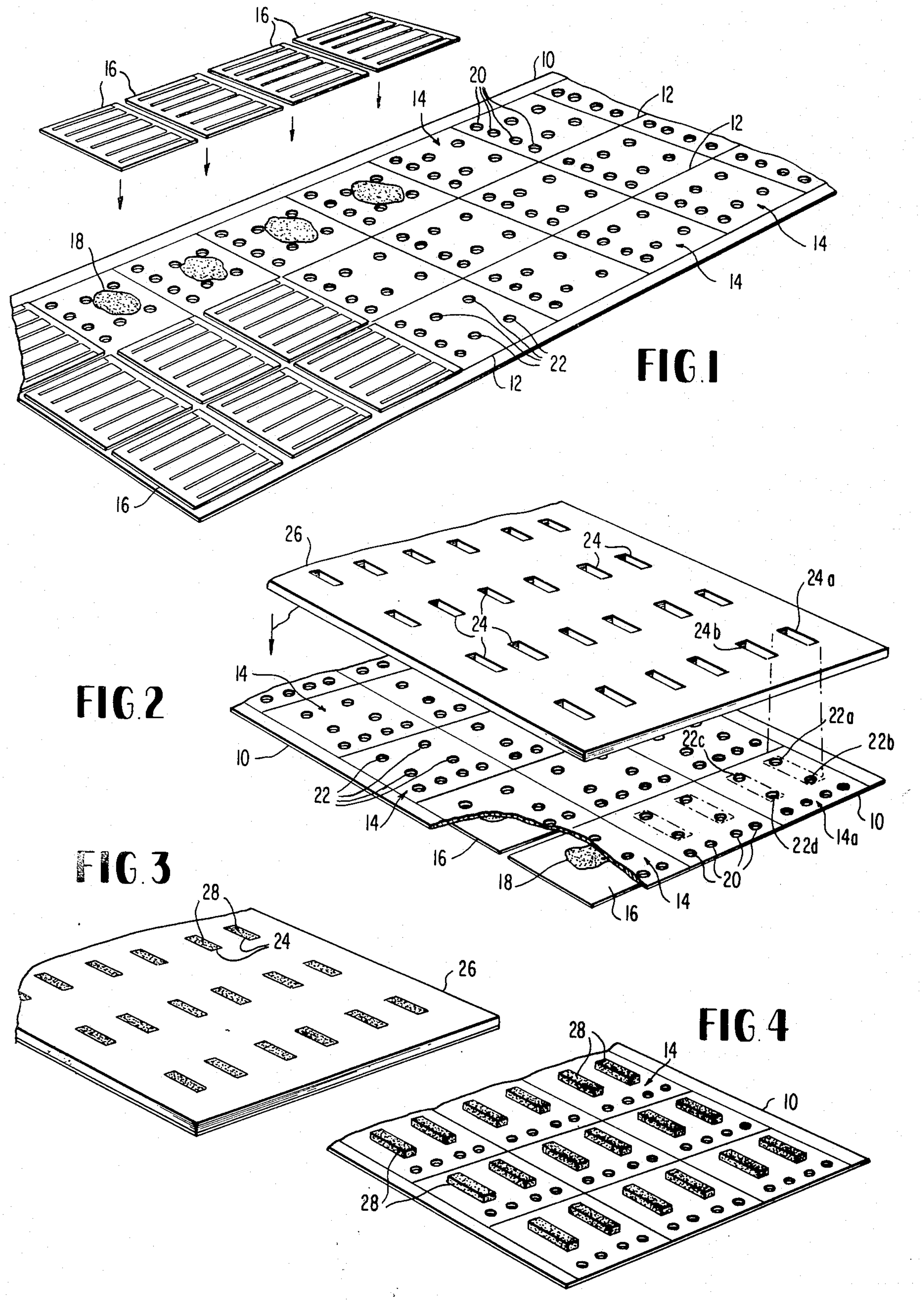
FIGS. 1–7 illustrate various steps in the process of forming a solar cell array in accordance with the present invention.

Referring to FIG. 1, there is shown a substrate 10 which has lines 12 pre-printed thereon by any known method. The lines 12 are pre-printed to form regions

14 arranged in columns and rows. Each region is of the same dimensions as the solar cells 16 which are to be placed on the regions. The solar cells 16 are any conventional solar cells having an electrode on the top surface and bottom surface. The substrate must be an insulating material and preferably is flexible at low temperatures, has high tensile strength, is radiation resistant, and has little or no outgasing. A preferred substrate is sold by Dupont Company under the trademark Kapton. The lines 12, which may simply be depressions formed in the substrate, are placed thereon merely to aid the fabricator in positioning the cells 16 onto the substrate. Although adjacent regions on the substrate are indicated as abutting, in actual practice there will be a small separation between adjacent regions 14.

Each region 14 in the substrate is provided with two groups of pre-punched apertures. The first group includes apertures 20 which, as will be explained more fully hereafter, are positioned to enable the interconnectors to be welded to the bottom electrodes of the cells. The second group includes apertures 22 which, as will be described more fully hereinafter, are positioned to enable the formation of a button type rubber adhesive holding member to be formed. The cells 16 are placed onto the respective regions and initially hold onto the substrate 10 by means of a pressure adhesive 18 such as silicone. The adhesive 18 may be placed either on the substrate or on the bottom of the cells initially, the difference not being material to the present invention. One important aspect of the placing of the adhesive 18 is that it must not be placed in the vicinity of the apertures 20.

After the cells 16 are properly positioned and held on the substrate 10, the substrate with the cells thereon is turned upside down as illustrated in FIG. 2 and a template or mask 26, preferably made of Teflon is placed over the substrate 10. The mask 26 has apertures 24 therein which communicate with apertures 22 in each of the regions 14. As illustrated in the drawing, aperture **24*a* overlies apertures 22*a* and 22*b* of region 14*a*, and aperture 24*b* overlies apertures 22*c* and 22*d* of region 14*a*. It should be noted that the particular arrangement illustrated in FIG. 2 is not critical. That is, the apertures in mask 26 may correspond 1 to 1 with the apertures in the substrate 10. The important features of the mask are that it includes apertures which communicate with and are larger than the apertures 22 of the regions 14**.

Figure 8:
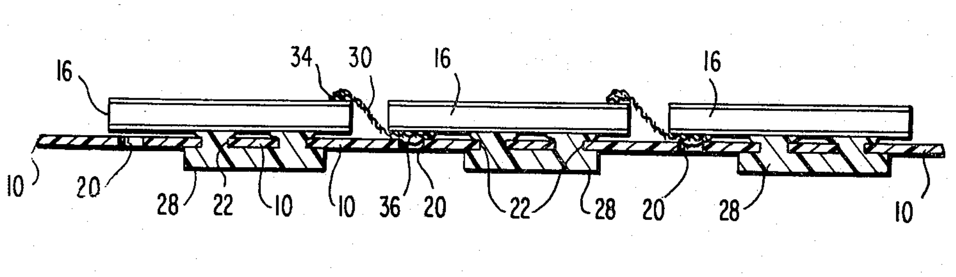
FIG. 8 is a cut-away sideview illustrating the relationship of cells, substrate, interconnectors and adhesive in an array formed by the method of FIGS. 1–7.

When the mask is in position, as illustrated in FIG. 3, an adhesive material 28, which is preferably a silicone rubber adhesive, is squeezed into the apertures 24 and therethrough to the apertures 22. When the adhesive cures, the mask 26 is removed, leaving rubbery fasteners 28, illustrated in FIG. 4, which extend through apertures 22 in substrate 10 and adhere firmly to the bottoms of the solar cells, and which mechanically hold the individual cells to the substrate 10. The relationship fo the rubbery holding elements 28 to the substrate 10 and the cells 16 can be seen more readily in FIG. 8.

It should be noted that the purpose of the button type holding means 28 is to secure the cells to the preferable substrate material, Kapton, which does not adhere very strongly to most known adhesives. However, if a substrate material 10 and an adhesve 18 are used, which strongly adhere to each other, the holding means 28 may be dispensed with and the initial adhesive 18 may be sufficient to securely hold the cells to the substrate under operating conditions. In this case, the second group of apertures, i.e., apertures 22, may also be dispensed with.

Figure 5:
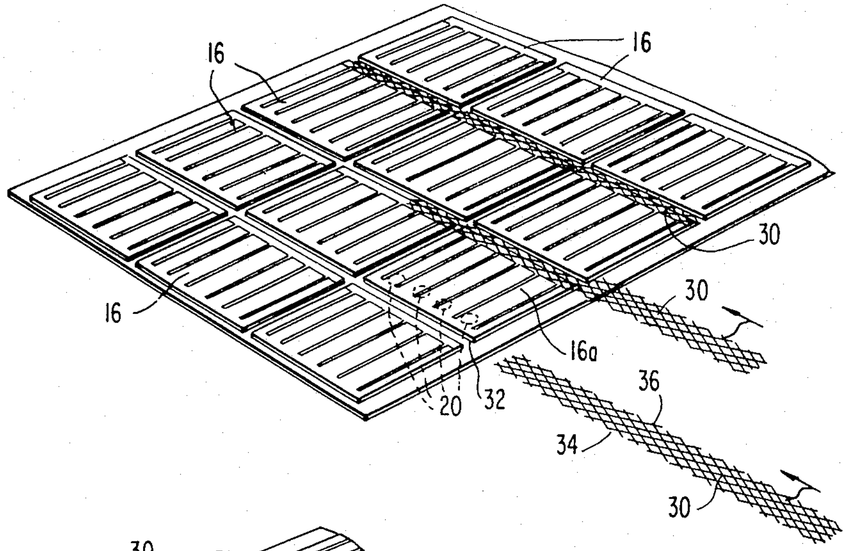

Following the previously described steps, the substrate with cells securely held thereto is turned right side up as illustrated in FIG. 5 and the metallic interconnectors 30 are inserted. Each metallic interconnector 30 is positioned so that left edge 34 overlies and touches the top electrodes of the cells 16 in one column and the right edge 36 underlies and touches the bottom electrodes of the cells in the adjacent column.

As will be recalled from the above description, no adhesive is placed in the vicinity of the first group of apertures 20. The relative position of the apertures 20 with respect to the particular cell **16*a* is illustrated in FIG. 5 by means of the phantom circles. Because of the position of the adhesive, the edge 32 of cells 16*a* may be lifted so that the edge 36 of interconnector 30 may be inserted underneath cell 16*a* between apertures 20** and the bottom electrode.

Figure 6:
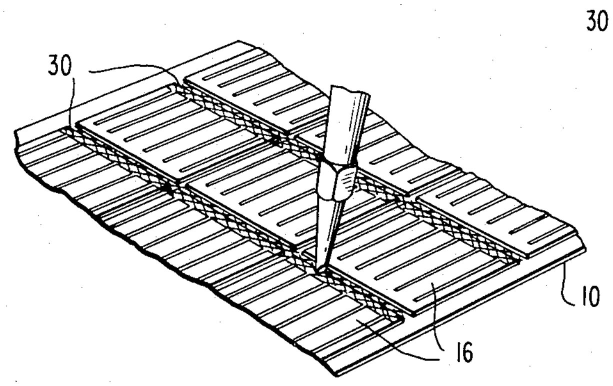
Figure 7:
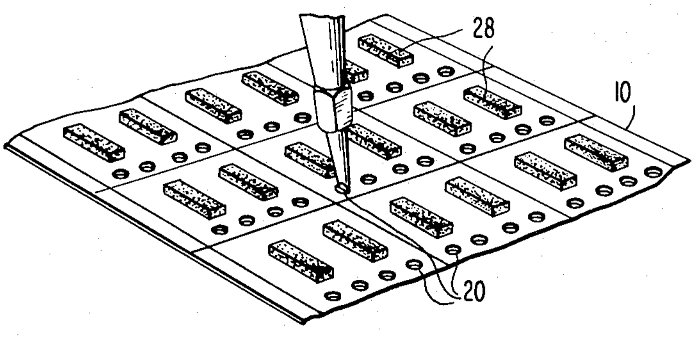

Next, the interconnectors 30 are welded or soldered to the upper electrodes as illustrated in FIG. 6. Then the substrate 10 with cells adhered thereto is turned upside down and the interconnectors 30 are welded to the bottom electrodes of the cells through the apertures 20 as illustrated in FIG. 7. A better view of the relationship of the interconnectors 30 and the apertures 20 can be seen in FIG. 8.

What is claimed is:

1. A solar cell array comprising: a plurality of individual solar cells, each having top and bottom electrodes, arranged on a flexible substrate in a matrix of rows and columns of cells, each column of cells being electrically connected to adjacent columns of cells by an interconnector connected between the top electrodes of the cells of one column and the bottom electrodes of the adjacent column, said substrate having apertures underlying the position of interconnection of every bottom electrode and every interconnector, and adhesive means between the bottom of each cell and said substrate in areas other than the area including said apertures.

2. A solar cell array as claimed in claim 1, further comprising a second group of apertures in said substrate underlying said cells and separated from the first mentioned apertures, and a plurality of button-type adhesive fasteners, each said fastener being chemically adhered to the bottom of one of said cells and extending through one of said second group of apertures and terminating in a bulk portion, too large to slip through said aperture, on the side of said substrate opposite said cells.

* * * * *